United States Patent
Zhao

(10) Patent No.: US 11,482,630 B2
(45) Date of Patent: Oct. 25, 2022

(54) METHOD FOR IMPROVING THE OHMIC-CONTACT BEHAVIOUR BETWEEN A CONTACT GRID AND AN EMITTER LAYER OF A SILICON SOLAR CELL

(71) Applicant: CE Cell Engineering GmbH, Kabelsketal (DE)

(72) Inventor: Hongming Zhao, Halle/Saale (DE)

(73) Assignee: CE CELL ENGINEERING GMBH, Kabelsketal (DE)

( * ) Notice: Subject to any disclaimer, the term of this patent is extended or adjusted under 35 U.S.C. 154(b) by 229 days.

(21) Appl. No.: 16/966,372

(22) PCT Filed: Feb. 5, 2019

(86) PCT No.: PCT/DE2019/000027
§ 371 (c)(1),
(2) Date: Jul. 30, 2020

(87) PCT Pub. No.: WO2019/154450
PCT Pub. Date: Aug. 15, 2019

(65) Prior Publication Data
US 2020/0365746 A1 Nov. 19, 2020

(30) Foreign Application Priority Data
Feb. 7, 2018 (DE) .................. 102018001057.1

(51) Int. Cl.
*H01L 31/18* (2006.01)
*H01L 31/0224* (2006.01)
*H01L 31/068* (2012.01)

(52) U.S. Cl.
CPC .... *H01L 31/022425* (2013.01); *H01L 31/068* (2013.01); *H01L 31/1804* (2013.01); *H01L 31/186* (2013.01)

(58) Field of Classification Search
CPC ............... H01L 31/186; H01L 31/1804; H01L 31/022425; H01L 31/208
See application file for complete search history.

(56) References Cited

U.S. PATENT DOCUMENTS

| | | | | |
|---|---|---|---|---|
| 4,166,918 A | * | 9/1979 | Nostrand | H01L 31/208 136/258 |
| 4,965,225 A | * | 10/1990 | Yamagishi | H01L 31/208 136/258 |
| 6,228,662 B1 | * | 5/2001 | Hayashi | H01L 31/20 136/258 |
| 6,365,825 B1 | * | 4/2002 | Hayashi | H01L 31/046 136/258 |
| 2012/0028396 A1 | * | 2/2012 | Gilman | H01L 31/1804 257/E31.124 |
| 2014/0026936 A1 | * | 1/2014 | Thaidigsmann | H01L 27/1421 438/98 |
| 2020/0365746 A1 | * | 11/2020 | Zhao | H01L 31/022425 |
| 2021/0288208 A1 | * | 9/2021 | Hongming | H01L 31/0516 |

FOREIGN PATENT DOCUMENTS

| | | | | |
|---|---|---|---|---|
| DE | 250247 A3 | | 10/1987 | |
| DE | 102011056843 A1 | | 6/2013 | |
| DE | 102016009560 A1 | * | 2/2018 | ..... H01L 31/022425 |
| EP | 0087776 A2 | * | 9/1983 | ............. H01L 31/18 |
| EP | 0134364 A2 | * | 3/1985 | ............. H01L 31/18 |
| EP | 1039553 A2 | * | 9/2000 | ............. H01L 31/18 |
| EP | 1494294 A2 | * | 1/2005 | ............. H01L 31/18 |
| EP | 2164114 A1 | | 3/2010 | |
| EP | 2583315 A2 | | 4/2013 | |
| EP | 3494601 B1 | * | 5/2021 | ..... H01L 31/022425 |
| TW | 200814347 A | * | 3/2008 | ......... H01L 31/1804 |
| WO | WO-2006059615 A1 | * | 6/2006 | ................ G01J 1/08 |

OTHER PUBLICATIONS

International Search Report issued in PCT/DE2019/000027 dated Jul. 18, 2019.

* cited by examiner

*Primary Examiner* — Earl N Taylor
(74) *Attorney, Agent, or Firm* — Blank Rome LLP

(57) ABSTRACT

The invention relates to a method for improving the ohmic-contact behaviour between a contact grid and an emitter layer of a silicon solar cell. The object of the invention is to propose a method for improving the ohmic-contact behaviour between a contact grid and an emitter layer of a silicon solar cell, in which the effects on materials caused by irradiation of the sun-facing side are further minimized. In addition, the method should also be applicable to silicon solar cells in which the emitter layer has a high sheet resistance. This object is achieved by first providing the silicon solar cell with the emitter layer, the contact grid and a rear contact, and electrically connecting the contact grid to one pole of a voltage source, then a contacting device that is electrically connected to the other pole of the voltage source is connected to the rear contact, and with the voltage source, a voltage is applied directed contrary to the forward direction of the silicon solar cell that is less than the breakdown voltage of the silicon solar cell and, when applying this voltage, a point light source is guided over the sun-facing side of the silicon solar cell and thereby a section of a subsection of the sun-facing side is illuminated and thus a current flow is induced in the subsection where the current flow relative to the section has a current density of 200 A/cm² to 20,000 A/cm² and acts on the subsection for 10 ns to 10 ms.

14 Claims, No Drawings

METHOD FOR IMPROVING THE OHMIC-CONTACT BEHAVIOUR BETWEEN A CONTACT GRID AND AN EMITTER LAYER OF A SILICON SOLAR CELL

This application is a national stage of International Patent Application No. PCT/DE2019/000027, filed Feb. 5, 2019, which claims the benefit of Germany Application No. 10 2018 001 057.1, filed Feb. 7, 2018, each of which are hereby incorporated by reference in their entirety.

The invention relates to a method for improving the ohmic-contact behaviour between a contact grid and an emitter layer in a silicon solar cell.

When creating contacts in a crystalline solar cell, a screen-printing technique is used to apply a metal paste in the form of a contact grid to the front side of the cell, which is coated with dielectric silicon nitride. After application, the metal paste is baked into the silicon nitride at 800-900° C. and thus forms an electrical contact to the emitter layer. The process control during the baking in of the metal paste has a critical influence on the contact formed, whereby faulty process control leads to high contact resistance at the transition between the metal paste and the emitter layer in the silicon solar cell. High contact resistances can then result in a reduced efficiency of the silicon solar cell.

Within the prior art, methods are known that permit the efficiency stabilization or performance improvement of solar cells. DE 10 2011 056 843 A1, for example, describes a method for "stabilization of an efficiency of silicon solar cells". In this, during the lamination process, a continuous flow of current is applied to a solar-cell assembly, which causes essentially boron-oxygen complexes to be broken down in the silicon material.

U.S. Pat. No. 4,166,918 A proposes a method for improving the performance of a solar cell, wherein the solar cell is subjected to a voltage applied contrary to its forward direction. In this case, a current flow is stimulated along short circuits within the solar cell, which causes them to be "burnt out" and thus eliminated.

These known methods have no known impact on the transition between the contact grid and emitter layer of a silicon solar cell.

To produce low-resistance electrical contacts to the emitter layer, low film resistances (less than 100 $\Omega$/sq) are required in the emitter layer. However, this leads to a poor conversion of short-wave light into electricity. Better conversion is achieved with sheet resistances in the range of 110-150 $\Omega$/sq. Here, however, only relatively high-impedance transitions between contact grid and emitter layer can be generated via the usual baking-in processes. To get around that, the concept of the selective emitter has been developed (for example, EP 2 583 315 B1). Here, the areas of the emitter layer that will subsequently be printed with the metal paste are locally doped to a higher degree so that the sheet resistance is locally lowered. This, however, requires expensive additional steps in the process for producing silicon solar cells.

From the field of electronic components, it is known from DD 250 247 A3 that the ohmic-contact behaviour towards semiconductor bodies that have been contacted by means of electrically conductive adhesive can be improved by applying a voltage pulse. The mode of action of the contact improvement is not described in further detail in the document. The electrically conductive adhesives used for contacting consist essentially of electrically conductive particles, usually silver balls or silver flakes, which are surrounded by a polymer matrix.

German patent application DE 10 2016 009 560.1, which has not yet been published, proposes a method for improving the ohmic-contact behaviour between a contact grid and an emitter layer in a silicon solar cell. In this case, the contact grid of a silicon solar cell is contacted with a contact-pin matrix, and a current flow is generated between the latter and the rear contact of this solar cell by means of voltage pulses. With pulse durations between 1 ms and 100 ms and induced currents in the range of 10-to-30 times the short-circuit current of the silicon solar cell, a high contact resistance between the contact grid and the emitter layer can be reduced and thus, for example, a faulty process control while baking in the metal paste can thus be corrected. Alternatively, a method is described, in which an electrically biased silicon solar cell is scanned with a point light source, whereby a current flow with a short-circuit current density of 10-to-30 times that of the silicon solar cell is generated in an illuminated subsection. Depending on the type and quality of the silicon solar cell, in certain configurations, irradiation of the sun-facing side of the silicon solar cell can cause unwanted effects on materials or even material damage.

The object of the invention is to develop the method for improving the ohmic-contact behaviour between a contact grid and an emitter layer of a silicon solar cell in such a way that the effects on materials caused by irradiation of the side facing the sun are further minimized. In addition, the method should also be applicable to silicon solar cells in which the emitter layer has a high sheet resistance.

This object is achieved by first providing a silicon solar cell with an emitter layer, a contact grid and a rear contact, and electrically connecting the contact grid to one pole of a voltage source. The other pole of the voltage source is electrically connected to a contacting device, which is placed on the rear contact. The voltage source then applies a voltage that is directed contrary to the forward direction of the silicon solar cell and that is lower in magnitude than the breakdown voltage of the silicon solar cell. When this voltage is applied, a point light source is then guided over the sun-facing side of the silicon solar cell and, in the process, a section of a subsection of the sun-facing side is illuminated. Thus, a current flow is induced in the subsection that, in relation to the section, has a current density of 200 A/cm$^2$ to 20,000 A/cm$^2$ and acts on the subsection for 10 ns to 10 ms.

With the method according to the invention, faulty process control during the baking in of the metal paste are compensated for, so that the solar cells nevertheless achieve their optimum serial resistance. In addition, with the method according to the invention, a very good ohmic contact behaviour between the contact grid and the emitter layer is achieved, even with emitter layers that have high film resistances, meaning that the process steps necessary for forming a selective emitter can be omitted. Furthermore, by using the method according to the invention, the baking-in process can be carried out at lower temperatures, so energy can be saved in the process for producing the silicon solar cell.

It is proposed that the point light source be a laser, a light-emitting diode or a flash lamp.

In one embodiment, the point light source has a power density of 500 W/cm$^2$ to 200,000 W/cm$^2$ on the section.

One version envisages that the point light source emit radiation of a wavelength in the range from 400 nm to 1500 nm.

In a further embodiment, the section has an area in the range from 10$^3$ µm$^2$ to 10$^4$ µm$^2$.

It is proposed that the voltage directed contrary to the forward direction of the silicon solar cell be in the range from 1 V to 20 V.

It is further proposed that the point light source be guided directly next to contact fingers of the contact grid on the sun-facing side of the silicon solar cell.

In one version, the silicon solar cell has a monofacial or bifacial form.

In another version, the silicon solar cell has an n- or p-doped silicon substrate.

One embodiment envisages that the emitter layer have a sheet resistance of more than 100 Ω/sq.

Embodiments of the invention are explained below.

First, a crystalline silicon solar cell is prepared. This has an anti-reflection layer of silicon nitride on its sun-facing side. An emitter layer of the silicon solar cell is arranged below this anti-reflection layer. On the sun-facing side, a front metallization is printed in the form of a contact grid consisting of contact fingers and collection contacts (busbars) made from a commercially available metal paste (e.g., silver paste), which has been cured according to the manufacturer's specifications and baked into the silicon nitride layer. On the side facing away from the sun, the silicon solar cell is equipped with a rear contact. This rear contact consists of a metallic layer, which can be designed either with passivation (PERC concept) or without.

The contact grid is electrically connected to one pole of a voltage source. The other pole of the voltage source is connected to a contacting device, which is connected to the rear contact. The voltage source then applies a voltage that is directed contrary to the forward direction of the silicon solar cell and that is lower in magnitude than the breakdown voltage of the silicon solar cell. When this voltage is applied, a point light source is guided over the sun-facing side of the silicon solar cell. The point light source can be, for example, a laser, a light-emitting diode or also the focused beam of a flash lamp. The invention is not limited to these radiation sources, however. The point light source emits radiation with wavelengths ranging from 400 nm to 1500 nm. A section of a subsection of the sun-facing side of the silicon solar cell is illuminated by this point light source, whereby a current flow is induced in the subsection. The current flow has a current density of 200 A/cm$^2$ to 20,000 A/cm$^2$ in relation to the section and acts on the subsection for 10 ns to 10 ms.

The high current densities necessary for improving the ohmic-contact behaviour between the contact grid and the emitter layer can be achieved by shifting the operating point of the illuminated cell area without causing radiation-induced material damage. In the interaction between the radiation density of the radiation source on the section, the contact time and the applied voltage, the necessary current densities are achieved without the need for material-damaging irradiation. In the case of an irradiated section with a surface diameter of approximately 60 μm, currents with a magnitude of 50 mA to 600 mA are usually generated at an applied voltage of 10 V, so that, based on the area of the irradiated section, a current density of around 200 A/cm$^2$ to 20,000 A/cm$^2$ acts. The completely flowing currents are kept low particularly by the relatively small area of the section receiving the rays.

Essentially, it is sufficient, when scanning the sun-facing side of the silicon solar cell, that the point light source be moved directly to the left and right of the contact fingers. Thus, the process times for processing a 6" cell with the method according to the invention is around one second.

In a further embodiment, the method according to the invention is applied to silicon solar cells where the contact grids had been baked in at a temperature lower than that recommended by the manufacturer of the metal paste. Usually, the baking in takes place at temperatures around 800° C. If the metal paste is baked in at a temperature of, for example, only 700° C., then the silicon solar cells have a high contact resistance at the transition between contact grid and emitter layer. Silicon solar cells of this type also exhibit an improvement of the ohmic-contact behaviour between the contact grid and the emitter layer with the method according to the invention. If the method according to the invention and a baking-in process carried out at lower temperatures are combined, the same contact resistance at the transition between the contact grid and the emitter layer is achieved while at the same time saving energy.

The method according to the invention is applicable both to monofacial and to bifacial silicon solar cells. For the latter, one-sided treatment is sufficient to optimize the contacts on both sides.

In another embodiment, the treatment is applied to silicon solar cells where the emitter layers have not been selectively formed and that thus have a high sheet resistance (more than 100 Ω/sq) over the entire surface. As described above, these silicon solar cells are also printed with the metal paste and then subjected to a baking-in process, whereby the baking-in process can also be carried out according to the manufacturer's instructions or at lower temperatures. After the baking-in process, the silicon solar cells have only a comparatively high value contact resistance at the transition between the contact grid and the emitter layer. With the application of the method according to the invention, the contact resistance is likewise reduced in these silicon solar cells by the interaction of the radiation density of the radiation source on the section, the contact time and the applied voltage, and reduces the value necessary for the optimal operation of the silicon solar cell. A selective emitter is therefore not necessary, so the costly steps for its production can be omitted.

The invention claimed is:

1. A process for improving the ohmic-contact behavior between a contact grid and an emitter layer in a silicon solar cell, the process comprising:
   providing the silicon solar cell with the emitter layer, the contact grid and a rear contact;
   electrically connecting the contact grid to one pole of a voltage source;
   electrically connecting a contacting device to another pole of the voltage source and to the rear contact;
   applying a voltage with the voltage source directed contrary to a forward direction of the silicon solar cell that is less than the breakdown voltage of the silicon solar cell; and,
   while applying the voltage, guiding a point light source over a sun-facing side of the silicon solar cell thereby illuminating a section of a subsection of the sun-facing side and thus inducing a current flow in the subsection, where the current flow relative to the section has a current density of 200 A/cm$^2$ to 20,000 A/cm$^2$ and acts on the subsection for 10 ns to 10 ms.

2. The process of claim 1, wherein the point light source is a laser.

3. The process of claim 1, wherein the point light source demonstrates a power density of 500 W/cm$^2$ to 200,000 W/cm$^2$ on the section.

4. The process of claim 1, wherein the point light source emits radiation with a wavelength in the range from 400 nm to 1500 nm.

5. The process of claim 1, wherein the section has an area ranging from $10^3$ μm² to $10^4$ μm².

6. The process of claim 1, wherein the voltage directed contrary to the forward direction of the silicon solar cell ranges from 1 V to 20 V.

7. The process of claim 1, wherein the point light source is guided directly next to contact fingers of the contact grid on the sun-facing side of the silicon solar cell.

8. The process of claim 1, wherein the silicon solar cell is monofacial.

9. The process of claim 1, wherein the silicon solar cell comprises an n-doped silicon substrate.

10. The process of claim 1, wherein the emitter layer has a sheet resistance of more than 100 Ω/sq.

11. The process of claim 1, wherein the silicon solar cell is bifacial.

12. The process of claim 1, wherein the silicon solar cell comprises a p-doped silicon substrate.

13. The process of claim 1, wherein the point light source is a light-emitting diode.

14. The process of claim 1, wherein the point light source is a flash lamp.

\* \* \* \* \*